(12) United States Patent
Cho

(10) Patent No.: US 6,400,021 B1
(45) Date of Patent: Jun. 4, 2002

(54) WAFER LEVEL PACKAGE AND METHOD FOR FABRICATING THE SAME

(75) Inventor: Soon Jin Cho, Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 4 days.

(21) Appl. No.: 09/604,040

(22) Filed: Jun. 27, 2000

(30) Foreign Application Priority Data

Jun. 29, 1999 (KR) .............................................. 99-25218

(51) Int. Cl.[7] .............................................. H01L 23/48
(52) U.S. Cl. ...................................................... 257/738
(58) Field of Search .................................. 257/738, 751, 257/753, 762, 763, 764, 765, 766, 779, 784

(56) References Cited

U.S. PATENT DOCUMENTS 5,323,051 A    6/1994   Adams et al. ............... 257/417

FOREIGN PATENT DOCUMENTS

| JP | 58165375 | 9/1983 |
|---|---|---|
| JP | 04084461 | 3/1992 |
| JP | 05291388 | 11/1993 |
| JP | 10-32280 | 2/1998 |
| JP | 10163405 | 6/1998 |
| JP | 10-256418 | 9/1998 |
| JP | 11007769 | 1/1999 |

*Primary Examiner*—David Nelms
*Assistant Examiner*—Quoc Hoang
(74) *Attorney, Agent, or Firm*—Pillsbury Winthrop LLP

(57) ABSTRACT

Disclosed is a wafer level package and a method for fabricating the wafer level package, in which the contact area between the ball land and the solder ball is enlarged, so that the adhesion force between them is highly strengthened. The wafer level package has a semiconductor chip having a lower dielectric layer formed at a bond pad forming surface thereof. The lower dielectric layer includes vias and grooves, and the bond pads are exposed through the vias. A metal pattern interconnecting the bond pads and the grooves with each other is deposited on the lower dielectric layer. An upper dielectric layer is applied on the lower dielectric layer. The upper dielectric layer has a ball land through which the metal pattern deposited on a surface of the grooves is exposed. A solder ball is mounted on the ball land.

5 Claims, 5 Drawing Sheets

WAFER LEVEL PACKAGE AND METHOD FOR FABRICATING THE SAME

BACKGROUND OF THE INVENTION

1. Field of the Invention

The present invention relates to a wafer level package and method for fabricating the same, in which the packaging process is performed in an original state of a wafer before the wafer is cut.

2. Description of the Related Art

In general, the conventional wafer is firstly cut along scribe lines to be divided into individual semiconductor chips, and then various packaging processes are individually performed for the individual semiconductor chips.

However, according to the conventional way of packaging as described above, there is a problem that the semiconductor chips should be individually subjected to a large number of separate processes of packaging, which means the number of the processes is too many in consideration of the number of the semiconductor chips fabricated from a single wafer.

Therefore, there is proposed a method for fabricating a package in recent times, in which the packaging process is performed in advance in a wafer state, which means an original state of the wafer before the wafer is cut, and then the wafer after being subjected to the packaging process is cut along scribe lines. The package fabricated according to the method as described above is called a wafer level package. FIGS. 1 and 2 show sectional views of a conventional wafer level package.

Referring to FIG. 1, at a surface of a wafer 1 is formed a protection layer 2 which is a silicon nitride film. A bond pad 1a of a semiconductor chip is disposed on the surface of the wafer 1 and is exposed through a slit formed by etching the protection layer 2.

In this state, a lower dielectric layer 3 is applied on the upper surface of the entire protection layer 2. Then, a portion of the lower dielectric layer 3 disposed above the bond pad 1a is etched to make the bond pad 1a be exposed. Thereafter, a metal film of copper or aluminum is vacuum-deposited on the surface of the entire construction. In this case, the metal film is deposited also on the bond pad 1a. Thereafter, the metal film is partially etched, so as to form a metal pattern 4 one end of which is electrically connected to the bond pad 1a. Thereafter, an upper dielectric layer 5 is applied on the lower dielectric layer 3, and then is partially etched, so as to make the other end of the metal pattern 4 be exposed. The exposed other end of the metal pattern 4 functions as a ball land 4a on which a solder ball 6 is loaded.

Thereafter, as shown in FIG. 2, the solder ball 6 is loaded on the ball land 4a, and then is adhered to the ball land 4a through a reflow process by means of ultraviolet rays, so that the bond pad 1a of the semiconductor chip and the solder ball 6 mounted to the substrate are electrically connected to each other. Finally, the wafer 1 is cut along scribe lines drawn on the wafer 1 to be divided into a plurality of semiconductor chips. Then, the wafer level packages are completed.

The wafer level package fabricated through the process as described above operates in a state that a solder ball is mounted to its printed circuit board (PCB). In this case, the package and the board have different coefficients of thermal expansion. By this reason, when heat generated respectively in the package and in the board is exchanged between the package and the board, thermal stress is applied to the solder ball of a very small size. In result, the adhesion force of the joint by the solder ball is weakened, and in the long run the joint by the solder ball is broken to make the electric connection be broken. Likewise, it is the highest priority to ensure a reliability of the joint by the solder ball in the wafer level package.

In order to ensure the reliability of the joint by the solder ball, it is inevitable to strengthen the adhesion force between the solder ball and the ball land. However, the conventional wafer level package has a very weak adhesion force between the solder ball and the ball land, because it has a very small contact area at which the solder ball and the ball land are in contact with each other.

In more detailed description, the ball land 4a which is the other end of the metal pattern 4 has a circular shape, and is surrounded by the upper dielectric layer 5, as shown in FIG. 3. The solder ball 6 is in contact with the ball land 4a while being in contact with the upper dielectric layer 5. Since the upper dielectric layer 5 is not metallically jointed to the solder ball 6, only the flat surface of the ball land 4a is jointed to the solder ball 6.

SUMMARY OF THE INVENTION

Accordingly, the present invention has been made in an effort to solve the problems occurring in the related art, and it is an object of the present invention to provide a wafer level package and a method for fabricating the wafer level package, in which the contact area between the ball land and the solder ball is enlarged, so that the adhesion force between them is highly strengthened.

In order to achieve the above object, a wafer level package in accordance with one aspect of the present invention includes a semiconductor chip having a lower dielectric layer formed at a bond pad forming surface thereof. The lower dielectric layer includes vias and grooves, and the bond pads are exposed through the vias. A metal pattern interconnecting the bond pads and the grooves with each other is deposited on the lower dielectric layer. An upper dielectric layer is applied on the lower dielectric layer. The upper dielectric layer has a ball land through which the metal pattern deposited on a surface of the grooves is exposed. A solder ball is mounted on the ball land.

Further to the construction as described above, it is preferred that an under bump metallurgy(UBM) is formed in a ball land including the inner walls of the grooves of the upper dielectric layer, so as to reinforce the adhesion force between the ball land and the solder ball. The solder ball is mounted on the UBM. The UBM includes a conductive adhesion layer, a diffusion-preventing layer, and a solder wettable layer in order upward from the bottom. The conductive adhesion layer is a layer, which is electrically connected to the metal pattern, so as to increase the adhesion force to the metal pattern. The diffusion-preventing layer is a layer for preventing the constituent of Tin in the solder ball from permeating the adhesion layer to form metal compounds weakening the adhesion force. The solder wettable layer is a soluble layer capable of strengthening the adhesion force between the solder wettable layer and the solder ball.

Instead of the conductive adhesion layer, the metal pattern may have a construction of three stories including the conductive adhesion layer, the diffusion-preventing layer, and the solder wettable layer, likely as the conductive adhesion layer.

As follows is a method for fabricating the wafer level package having the construction as described above.

A lower dielectric layer is applied on a surface of a wafer including a plurality of semiconductor chips. The lower dielectric layer is etched so as to make the bond pads be exposed. Grooves are formed by etching portions of the lower dielectric layer spaced with a predetermined distance apart from the bond pads. A metal layer is deposited on the lower dielectric layer. The metal layer may be formed as a single layer or three-story laminated layers of the conductive adhesion layer, the diffusion-preventing layer, and the solder wettable layer. The metal layer is patterned in such a manner that there remains only the portion interconnecting the bond pads and the grooves with each other. After an upper dielectric layer is deposited on the lower dielectric layer, a portion of the upper dielectric layer on the grooves is etched, so as to form a ball land through which a portion of the metal pattern deposited on the grooves is exposed. The solder ball is mounted on the ball land, and then is firmly adhered thereto through a reflow process.

In the case where the metal layer is formed as a single layer, on the surface of the entire construction is deposited an UBM including a conductive adhesion layer, a diffusion-preventing layer, and a solder wettable layer. After the diffusion-preventing layer is patterned so that there remains only the ball land portion, the solder ball is mounted on the UBM. In the case where the metal layer is formed to have the construction of three stories as described above, the UBM is not necessary.

According to the construction of the present invention as described above, since grooves are formed in the ball land, the contact area between the solder ball and the ball land is highly enlarged. Therefore, the adhesion force by the solder ball is strengthened.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

The above and other objects, characteristics, and advantages of the present invention will become apparent from the following description with reference to the accompanying drawings.

Embodiment 1

FIGS. 4 to 11 are sectional views for sequentially showing the steps of a process for fabricating a wafer level package in accordance with the first embodiment of the present invention.

Figure 1:
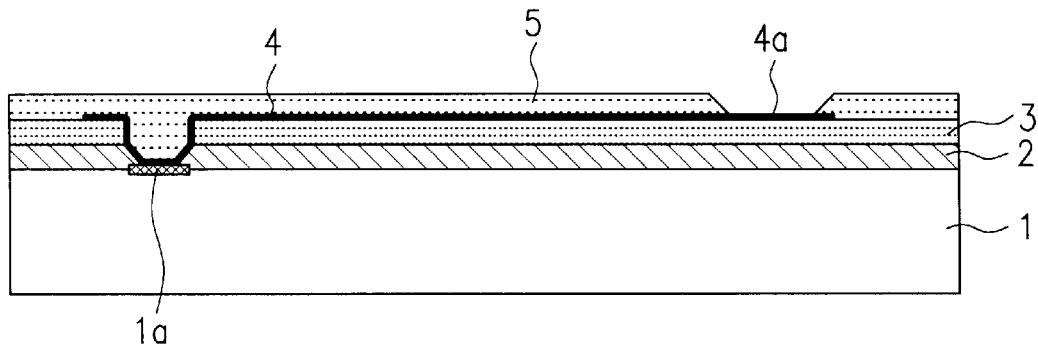
FIG. 1 and FIG. 2 are sectional views of a conventional wafer level package.
Figure 2:
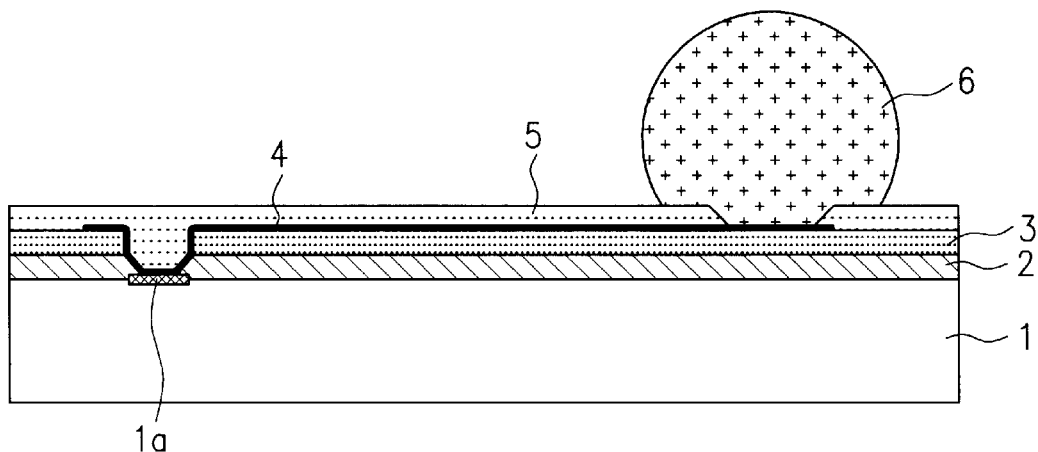
Figure 3:
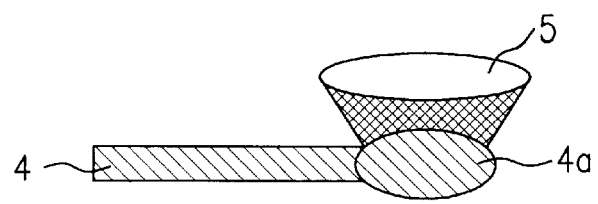
FIG. 3 is an enlarged perspective view of the ball land of the conventional wafer level package.
Figure 4:
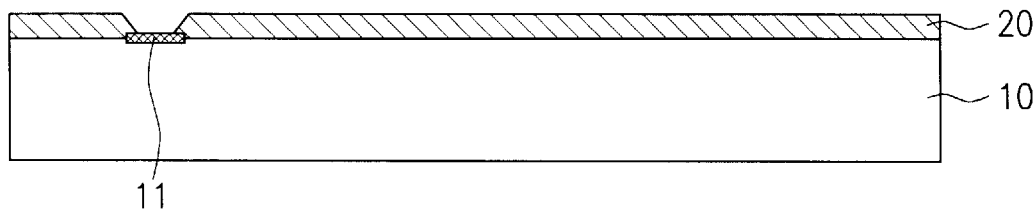
FIGS. 4 to 11 are sectional views for sequentially showing the steps of a process for fabricating a wafer level package in accordance with the first embodiment of the present invention.

First, a wafer 10 as shown in FIG. 4 is prepared. The wafer 10 includes a plurality of semiconductor chips mounted thereto, each of which has a bond pad 11 disposed on a surface of the wafer 10. Accordingly, the surface of the wafer 10 serves as a bond pad forming surface, in FIG. 4.

Further, on the surface of the wafer 10 is applied a lower dielectric layer 30 for protecting the semiconductor chips, which is made from silicon nitride. A predetermined portion of a protection layer 20 is etched, so that the bond pad 11 is exposed through the protection layer 20.

Figure 5:
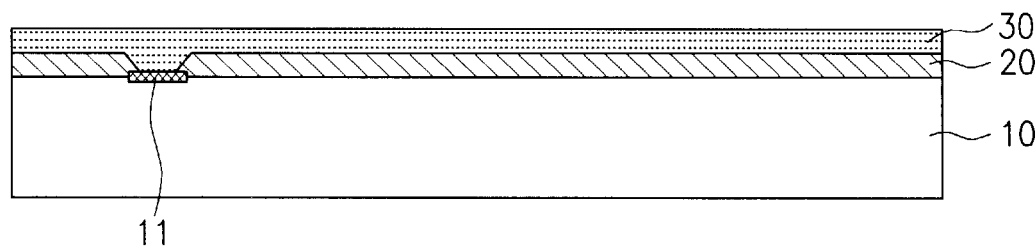

As shown in FIG. 5, the lower dielectric layer 30 is applied by a spin coating on the surface of the wafer 10 as described above. The lower dielectric layer 30 functions to make the surface of the wafer 10 be even and to electrically insulate the bond pad 11 from a metal layer to be formed thereafter. The lower dielectric layer 30 may be made from polyimide or benzocyclobutene-based polymer.

Figure 6:
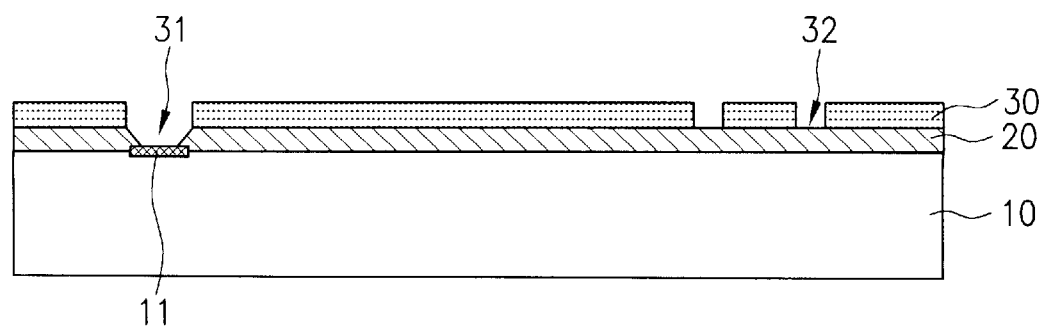

Thereafter, a portion of the lower dielectric layer 30 above the bond pad 11 is etched to form a via 31, as shown in FIG. 6. The bond pad 11 is exposed to the exterior through the via 31. Further, the right portion of the lower dielectric layer 30, on which a solder ball 60 is to be loaded later, is etched to form at least two grooves 32.

Figure 7:
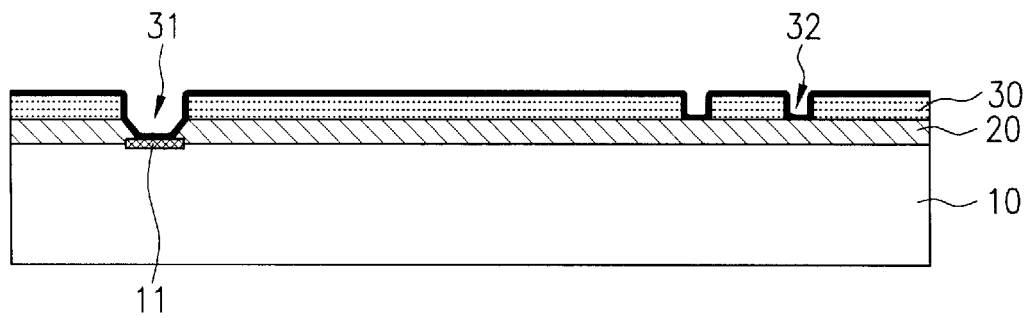

Thereafter, as shown in FIG. 7, a metal layer 40 is deposited on the lower dielectric layer 30 by a method such as a sputtering or a chemical vapor deposition. The metal layer 40 electrically interconnects the bond pad 11 and the grooves 32 with each other.

In this case, the metal layer 40 may be a single layer of copper or aluminum, or may have a construction of multiple-layers in which a plurality of metal layers are laminated. This first embodiment employs the construction of multiple-layers. That is, the metal layer 40 includes a conductive adhesion layer, a diffusion-preventing layer, and a solder wettable layer in order upward from the bottom. The conductive adhesion layer is a layer, which is electrically connected to the bond pad 11 made from aluminum and is firmly adhered to the lower dielectric layer. The diffusion-preventing layer is a layer for preventing the constituent of Tin in the solder ball from permeating the adhesion layer to form metal compounds weakening the adhesion force. The solder wettable layer has a characteristic of solubility, that is, the solder wettable layer is a soluble layer which strengthens the adhesion force between the solder wettable layer and the solder ball. The metal layer 40 having the construction of three-stories can be made from a material selected from the group consisting of layers of aluminum/nickel/copper, aluminum/titanium/copper, aluminum/chrome+copper/copper, titanium/titanium+tungsten/copper, and chrome/chrome+copper/copper.

In this case, before the metal layer 40 is deposited, it is preferred that the lower dielectric layer 30 is cleaned by a method of reactive ion etching or RF sputtering by means of argon ions or nitrogen ions. Such a cleaning as above strengthens the adhesion force between the metal layer 40 and the lower dielectric layer 30.

Figure 8:
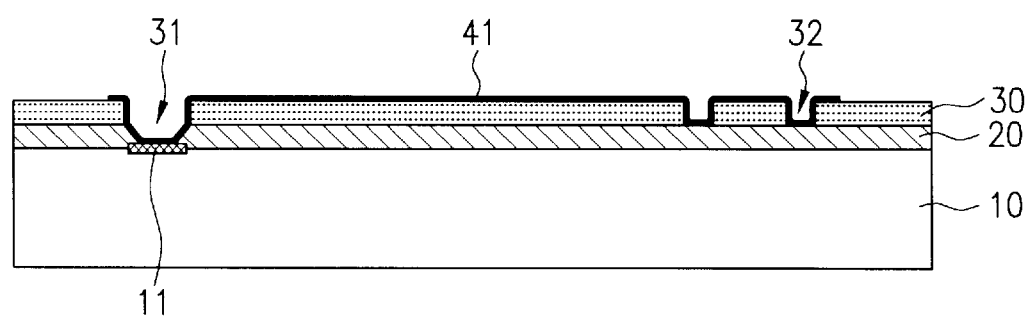
Figure 9:
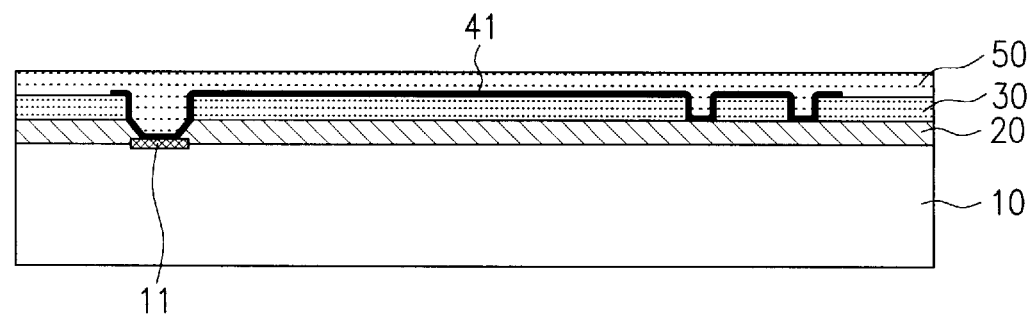

Thereafter, as shown in FIG. 8, the metal layer 40 is patterned by a step-etching, so as to form a metal pattern 41 interconnecting the bond pad 11 and the grooves 32 with each other. Thereafter, an upper dielectric layer 50 is applied on the lower dielectric layer 30, as shown in FIG. 9.

Figure 10:
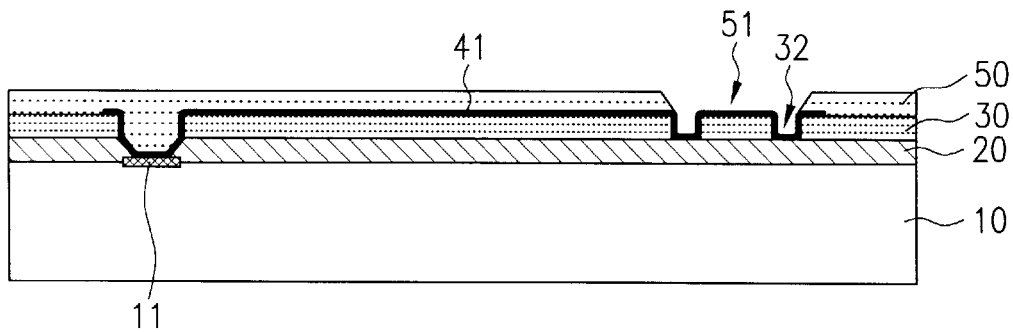

Then, as shown in FIG. 10, the upper dielectric layer 50 applied on the grooves 32 is selectively etched, so as to form a ball land 51. A portion of the metal pattern 41 deposited on the grooves 32 is exposed through the ball land 51.

Figure 11:
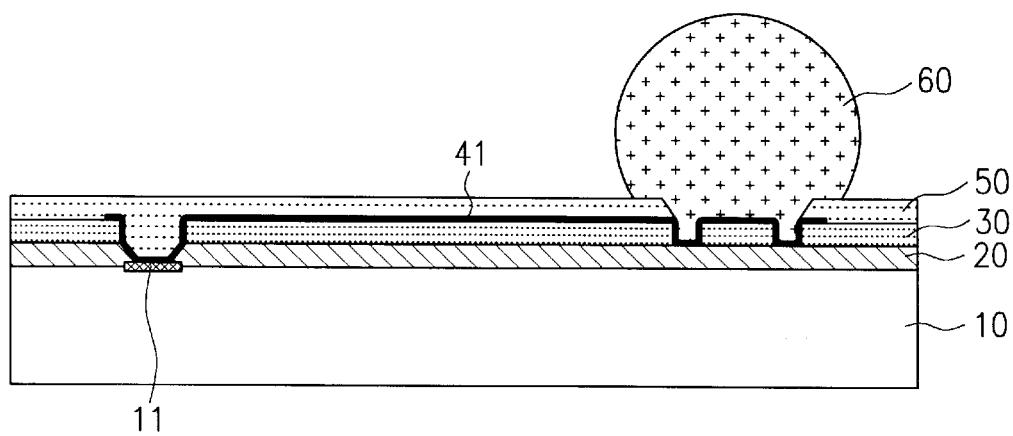

Next, as shown in FIG. 11, the solder ball 60 is put on the ball land 51, and then the solder ball 60 is firmly adhered to the ball land 51 through a reflow process by means of ultraviolet rays. In this case, the portion of the metal pattern 41 with which the solder ball 60 is in contact does not have a simple flat shape as that in the prior art, but has an uneven shape. Accordingly, the solder ball 60 is inserted in the grooves 32 also, so that the contact area between the solder ball 60 and the metal pattern 41 is enlarged by a degree corresponding to the length of the inner wall of the grooves 32. Especially, since the bottom surface of the grooves 32 is formed of a silicon nitride film, and since the solder ball 60 is directly in contact with the nitride film 20, the adhesion force is largely strengthened in comparison with the case where the solder ball is in contact with the metal layer.

Finally, cutting is performed along scribe lines drawn on the wafer 10, so that separated packages each of which contains a semiconductor chip packaged therein are produced.

Embodiment 2

Figure 12:
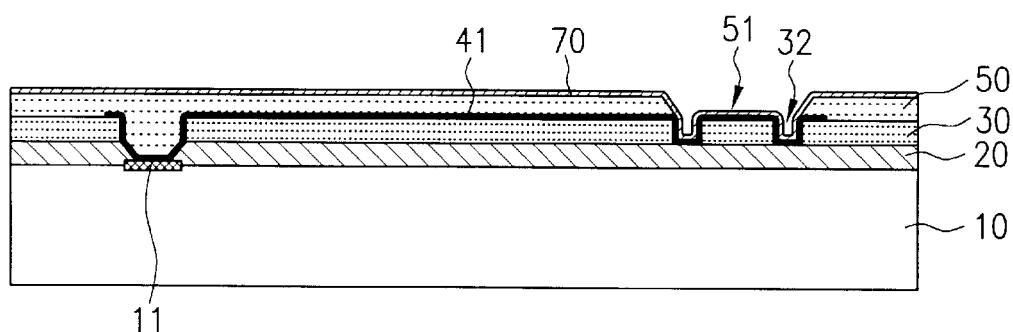
FIGS. 12 to 14 are sectional views for sequentially showing the steps of a process for fabricating a wafer level package in accordance with the second embodiment of the present invention.
Figure 13:
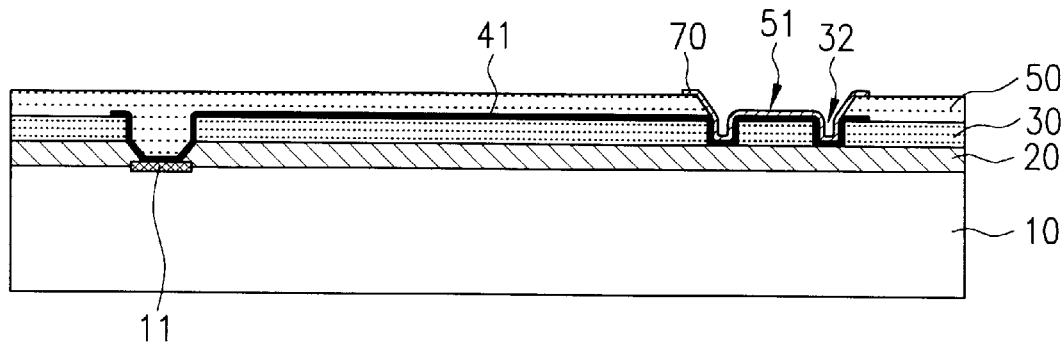
Figure 14:
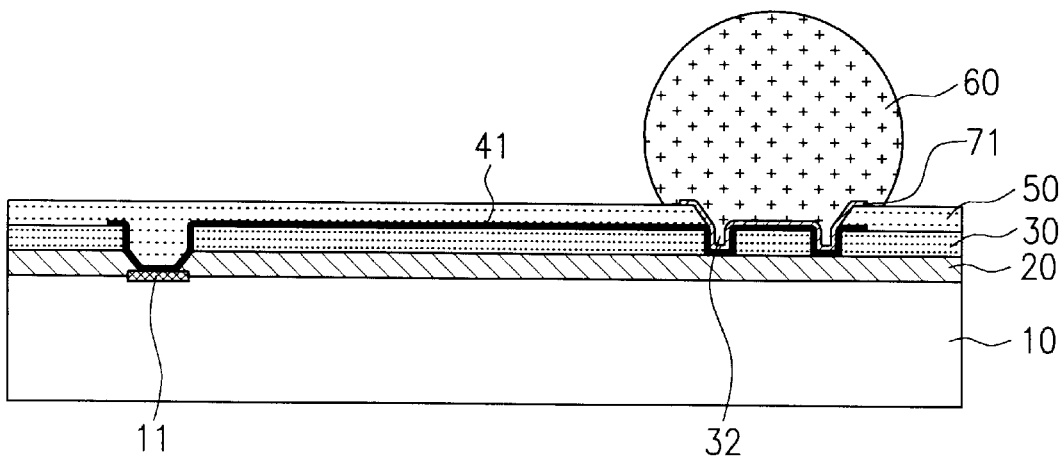

FIGS. 12 to 14 are sectional views for sequentially showing the steps of a process for fabricating a wafer level package in accordance with the second embodiment of the present invention.

In this package according to the second embodiment, the metal layer 40 has a different construction, in comparison with the package according to the first embodiment. That is, the package of the second embodiment has a metal film having a construction of single-story, while the package of the first embodiment has a metal film having the construction of three-stories.

Instead, a process for fabricating a package according to. the second embodiment has the same steps as the steps shown in FIGS. 1 to 10 according to the first embodiment. After the step shown in FIG. 10, the process of the second embodiment has further steps of fabricating different from those in the first embodiment. That is, before the solder ball is mounted onto the ball land, an UBM 70 is deposited on the upper surface of the entire construction. The UBM 70 has the same construction and material as those of the metal layer 40 in the first embodiment.

The UBM 70 is etched in such a manner that there remains only the portion of the UBM 70 deposited on the ball land 51, so as to form an UBM 71, as shown in FIG. 13. The UBM 71 is deposited not only on the metal pattern 41 deposited on the surface of the grooves 32, but also on the side walls of the upper dielectric layer 50, which is the most different point in comparison with the first embodiment. That is, comparing FIG. 10 and FIG. 13 with each other, while the metal pattern 41 is not deposited on the side walls of the upper dielectric layer 50 in FIG. 10, the UBM 71 is deposited on the side walls of the upper dielectric layer 50 in FIG. 13. Therefore, the solder ball 60 is in contact only with the metal pattern 41 deposited on the surface of the grooves 32, in FIG. 11. On the contrary, since the solder ball 60 is in contact with the UBM 71 deposited on the side walls of the upper dielectric layer 50 and the grooves 32, the contact area of the solder ball 60 is further enlarged in comparison with the first embodiment.

In the meantime, in the same way as the lower dielectric layer 30 is cleaned before the metal layer 40 is deposited in the first embodiment, it is preferred that the upper dielectric layer 50 is cleaned before the UBM 70 is deposited.

According to the present invention as described above, grooves are formed at the ball land portion, and a metal pattern is deposited on the surface of the grooves, so that the deposition area for the metal pattern is enlarged. Accordingly, the contact area between the solder ball and the metal pattern is enlarged, and thereby the adhesion force between them is strengthened.

While there have been illustrated and described what are considered to be preferred specific embodiments of the present invention, it will be understood by those skilled in the art that the present invention is not limited to the specific embodiments thereof, and various changes and modifications and equivalents may be substituted for elements thereof without departing from the true scope of the present invention.

What is claimed is:

1. A wafer level package comprising:

a semiconductor chip;

a plurality of bond pads formed on a surface of the semiconductor chip;

a lower dielectric layer formed on the surface of the semiconductor chip, the lower dielectric layer having vias and grooves, wherein the vias expose the bond pads and the grooves are disposed at a position spaced a predetermined distance from the vias;

a metal pattern deposited on a surface of the lower dielectric layer, a surface of the vias, and a surface of the grooves;

an upper dielectric layer formed on the lower dielectric layer and the metal pattern, the the upper dielectric layer comprising ball lands through which a portion of the metal pattern deposited on a surface of the grooves is exposed;

an upper bump metal pattern formed on the portion of the metal pattern exposed at the ball lands and sidewalls of the upper dielectric layer; and a solder ball formed on the under bump metal pattern formed on the ball lands, the solder ball being electrically connected to the metal pattern deposited on the grooves.

2. A wafer level package according to claim 1, wherein the metal pattern is a multi-layer structure comprising:

a conductive adhesion layer formed on and electrically connected to the bond pads;

a diffusion-preventing layer formed on the conductive adhesion layer, the diffusion-preventing layer being sufficient to prevent diffusion of a material from the solder ball into the conductive adhesion layer; and a soluble solder wet layer formed on the diffusion-preventing layer, the soluble solder wet layer acting to increase an adhesion force between the solder wet layer and the solder ball.

3. A wafer level package according to claim 2, wherein the metal pattern is multi-layer structure comprising a sequence of three metallic layers, the sequence of three metallic layers being selected from the group consisting of aluminum/nickel/copper, aluminum/titanium/copper, aluminum/chrome+copper/copper, titanium/titanium+tungsten/copper, and chrome/chrome+copper/copper.

4. A wafer level package according to claim 1, wherein the under bump metal comprises:

a conductive adhesion layer electrically connected to the metal pattern in the ball land;

a diffusion-preventing layer formed on the conductive adhesion layer, the diffusion-preventing layer being sufficient to prevent diffusion of a material from the solder ball into the conductive adhesion layer; and a soluble solder wet layer formed on the diffusion-preventing layer, the soluble solder wet layer acting to increase an adhesion force between the solder wet layer and the solder ball.

5. A wafer level package according to claim 4, wherein the under bump metal is is multi-layer structure comprising a sequence of three metallic layers, the sequence of three metallic layers being selected from the group consisting of aluminum/nickel/copper, aluminum/titanium/copper, aluminum/chrome+copper/copper, titanium/titanium+tungsten/copper, and chrome/chrome+copper/copper.

* * * * *